(12) United States Patent
Sasaki (10) Patent No.: US 8,723,301 B2
(45) Date of Patent: *May 13, 2014

(54) SEMICONDUCTOR PACKAGE AND SYSTEM (71) Applicant: Renesas Electronics Corporation, Kawasaki (JP)

(72) Inventor: Kou Sasaki, Kawasaki (JP)

(73) Assignee: Renesas Electronics Corporation, Kawasaki, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/655,309

(22) Filed: Oct. 18, 2012

(65) Prior Publication Data

US 2013/0037928 A1   Feb. 14, 2013

Related U.S. Application Data

(63) Continuation of application No. 12/926,131, filed on Oct. 27, 2010, now Pat. No. 8,310,035.

(30) Foreign Application Priority Data

Nov. 10, 2009   (JP) ................................. 2009-257318

(51) Int. Cl.
*H01L 21/02* (2006.01)
(52) U.S. Cl.
USPC ...... 257/676; 257/686; 257/693; 257/E23.01; 257/E25.03
(58) Field of Classification Search
USPC .......... 257/676, 686, 692, 693, E23.01, 25.03
See application file for complete search history.

(56) References Cited

U.S. PATENT DOCUMENTS

| 4,859,807 | A | 8/1989 | Swiggett et al. |
| 5,028,983 | A | 7/1991 | Bickford et al. |
| 8,310,035 | B2 * | 11/2012 | Sasaki ........................... 257/676 |
| 2002/0072147 | A1 | 6/2002 | Sayanagi et al. |
| 2002/0181185 | A1 | 12/2002 | Kabumoto et al. |
| 2005/0263863 | A1 | 12/2005 | Sasaki et al. |
| 2008/0230888 | A1 | 9/2008 | Sasaki |
| 2009/0250801 | A1 | 10/2009 | Isa et al. |
| 2009/0283883 | A1 | 11/2009 | Igarashi et al. |
| 2011/0284989 | A1 | 11/2011 | Umeno |

FOREIGN PATENT DOCUMENTS

| JP | 07-161865 | 6/1995 |
| JP | 2004-64851 | 2/2004 |
| JP | 2007-12690 | 1/2007 |
| JP | 2007-157985 | 6/2007 |

OTHER PUBLICATIONS

Koichi Nose et al., "A 0.016 mm², 2.4GHz RF signal Quality Measurement Macro for RF Test and Diagnosis" IEEE Journal of Solid-State Circuits, vol. 43, No. 4 Apr. 2008, pp. 1038-1046.

Kiichi Niitsu et al., "An inductive-Coupling Link for 3D Integration of 90 nm CMOS Processor and a 65 nm CMOS SRAM" ISSCC Dig. Tech. Papers, pp. 480-482, Feb. 2009.

A compact RF signal quality measurement macro for RF test and diagnosis, Koichi Nose and Masayuki Mizuno.

* cited by examiner

*Primary Examiner* — Michael Lebentritt
(74) *Attorney, Agent, or Firm* — McGinn IP Law Group, PLLC (57) ABSTRACT

A semiconductor package includes a package board, a pellet provided over the package board, and a protection member covering the package board and the pellet and including a hole penetrating the protection member.

8 Claims, 7 Drawing Sheets

SEMICONDUCTOR PACKAGE AND SYSTEM

CROSS-REFERENCE TO RELATED APPLICATIONS

The present application is a Continuation Application of U.S. patent application Ser. No. 12/926,131, filed on Oct. 27, 2010, which is based on and claims priority from Japanese patent application No. 2009-257318, filed on Nov. 10, 2009, the entire contents of which is incorporated herein by reference.

BACKGROUND OF THE INVENTION

The present invention relates to semiconductor packages and systems and in particular to a semiconductor package and a system wherein necessity for mounting to a mounting board by solder is obviated.

Figure 1:
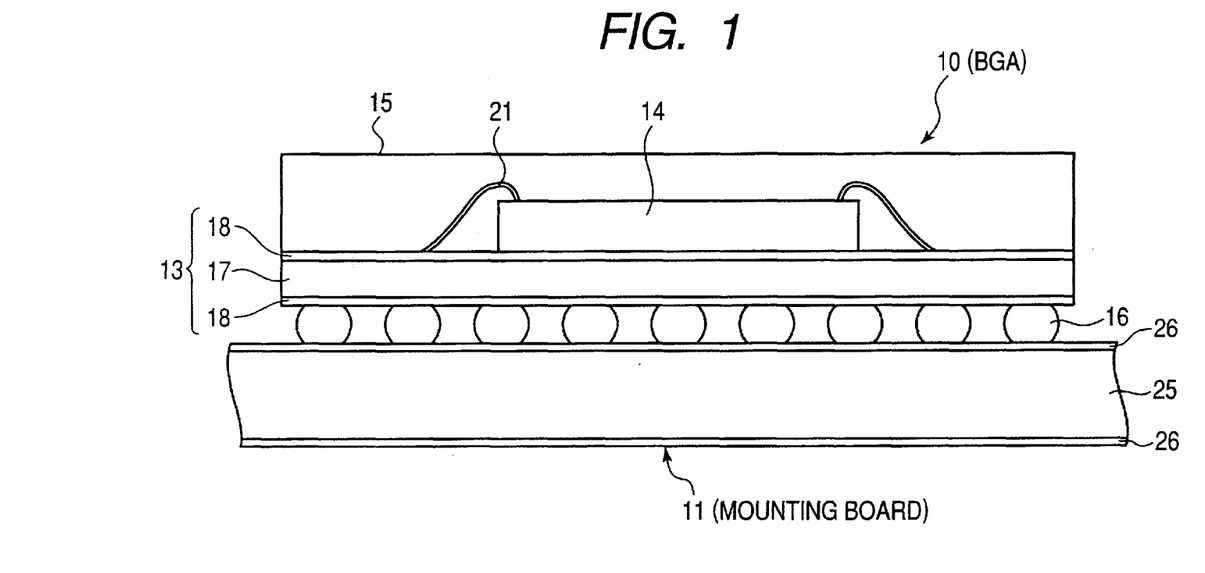
FIG. 1 is a drawing illustrating the configuration of a semiconductor package according to a conventional technology.

There are conventionally known technologies for mounting a ball grid array package 10 (hereafter, abbreviated as BGA 10) over a mounting board 11 as illustrated in FIG. 1. (Refer to Patent Document 1.) In the technology disclosed in Patent Document 1, BGA 10 is comprised of a package board 13, a semiconductor element 14, a protection member 15, and a solder ball 16. The package board 13 is comprised of a core base material 17 composed of glass cloth, resin, or the like and solder resist 18 covering the upper surface and lower surface of the core base material 17 in the drawing.

An opening is provided in the solder resist 18 covering the upper surface of the core base material 17 and a bonding pad formed over the core base material 17 is exposed from this opening. This bonding pad is coupled to a wiring pattern provided in the upper surface of the core base material 17 and this wiring pattern is coupled to a via hole so provided that it penetrates the core base material 17.

The semiconductor element 14 and this bonding pad are coupled together through a bonding wire 21 and as a result, the semiconductor element 14 and the package board 13 are electrically coupled together. In the lower surface of the core base material 17, a substantially oval ball land is formed. This ball land is coupled with the above-mentioned via hole so formed that it penetrates the core base material 17 and is electrically coupled to the semiconductor element 14 through the following: the wiring pattern provided in the upper surface of the core base material 17, a bonding pad, and a bonding wire 21 bonded with this bonding pad. This ball land is exposed from an opening provided in the solder resist 18 covering the lower surface of the core base material 17. Before the BGA 10 is mounted to the mounting board 11, the solder ball 16 is placed over a ball land by a ball placer, not shown. The placed solder ball 16 is joined to the ball land by IR reflow processing or the like and the joined solder ball 16 makes an external connection terminal electrically coupled with the semiconductor element 14. The protection member 15 protects the semiconductor element 14 and the bonding wire 21.

Similarly with the package board 13, the mounting board 11 is comprised of a core base material 25 and solder resist 26 covering the upper surface and lower surface thereof in the drawing. In the upper surface of the core base material 25, there is formed an area (mounting area) where the BGA 10 is mounted. In this mounting area, there is formed a substantially oval junction land corresponding to a solder ball 16 joined to a ball land of the BGA 10. This junction land is exposed from an opening formed in the solder resist 26 covering the upper surface of the mounting board 11. The junction land is electrically coupled with some other mounted electronic component or a power supply through a wiring pattern formed in the upper surface of the mounting board 11. When the BGA 10 is mounted to the mounting board 11, the solder balls 16 of the BGA 10 are abutted against the above-mentioned junction lands provided in the mounting board 11. Subsequently, the BGA 10 and the mounting board 11 are subjected to IR reflow and as a result, the solder balls 16 are joined to the junction lands of the mounting board 11 and mounting of the BGA 10 to the mounting board 11 is completed.

Patent Document 2 discloses a technology for fixing a semiconductor package over a circuit board. In this technology, the semiconductor package is fixed over the circuit board by: passing a bolt through an insertion hole in the semiconductor package and inserting the bolt into a communication hole in the circuit board; and screwing a nut onto the tip of the bolt that penetrates the circuit board and is protruded therefrom.

Patent Document 3 discloses a non-contact power supply system using electromagnetic induction based on a printed coil.

Patent Document 4 discloses that in an electrical apparatus provided with a primary coil and a secondary coil, power is transmitted to the secondary coil in a non-contact manner by supplying a current to the primary coil.

Non-patent Document 1 discloses a technology related to measurement of 2.4 GHz RF signal quality. Non-patent Document 2 discloses a technology related to communication through an antenna using a coil.

[Patent Document 1] Japanese Unexamined Patent Publication No. 2007-12690

[Patent Document 2] Japanese Unexamined Patent Publication No. Hei 07 (1995)-161865

[Patent Document 3] Japanese Unexamined Patent Publication No. 2007-157985

[Patent Document 4] Japanese Unexamined Patent Publication No. 2004-064851

[Non-patent Document 1] Koichi Nose et al., "A 0.016 mm$^2$, 2.4 GHz RF signal Quality Measurement Macro for RF Test and Diagnosis" IEEE JOURNAL OF SOLID-STATE CIRCUITS, VOL. 43, NO. 4 APRIL 2008, pp 1038-1046

[Non-patent Document 2] Kiichi Niitsu et al., "An inductive-Coupling Link for 3D Integration of 90 nm CMOS Processor and a 65 nm CMOS SRAM" ISSCC Dig. Tech. Papers, pp. 480-482, February 2009.

SUMMARY

The present inventors founds that the technology disclosed in Patent Document 1 involves the following problems. As mentioned above, the BGA 10 in FIG. 1 is mounted to the mounting board 11 using solder balls 16. When a semiconductor package (equivalent to the BGA 10 in FIG. 1) including a semiconductor element (pellet) is mounted to a mounting board by solder, the following takes place: it is difficult to dismount a once mounted semiconductor package and mount a different non-defective semiconductor package to the identical mounting board again. The reason for this is as follows. Usually, semiconductor packages should be screened through quality inspection or the like and non-defectives should be shipped. Nevertheless, a defective may be produced among mounted semiconductor packages because of stress applied during mounting, deterioration with age, or the like. Therefore, even in cases where one semiconductor package is defective, for example, when multiple semiconductor packages are mounted to a mounting board to build a system, it used to be inevitable to take the following measure: it used to be inevitable to discard the value-added mounting board mounted with non-defective semiconductor packages in its entirety. The reason for this is as follows:

To mount semiconductor packages using solder balls, it is required to carry out infrared reflow (hereafter, referred to as IR reflow) as described in Patent Document 1. In this IR reflow, a mounting board itself mounted with the semiconductor packages is placed in a furnace for IR reflow and heat is applied to the entire semiconductor packages mounted over the mounting board. Therefore, stress of heat arising from the IR reflow is applied to all the semiconductor packages mounted over the mounting board.

The maximum number of times of IR reflow that can be carried out on semiconductor packages is prescribed beforehand. In case of NEC Electronics Corporation, for example, it is prescribed that IR reflow in which heat at 260 degrees may be carried out up to twice on semiconductor packages specified as IR60-103-2. When a system is built over a mounting board at the corporation, IR reflow is carried out to mount multiple semiconductor packages. Even if one semiconductor package thereafter becomes defective and this semiconductor package is found to be a defective, IR reflow must be carried out again to dismount this defective semiconductor package. To carry out IR reflow, as mentioned above, the mounting board itself must be placed in a furnace. As a result, stress of heat arising from the IR reflow is also applied to the other non-defective semiconductor packages. To replace the defective semiconductor package with a non-defective semiconductor package and mount it over the mounting board, IR reflow must be carried out once again. That is, even when it is desired to dismount only a defective semiconductor package mounted over a mounting board and replace it with a non-defective semiconductor package, stress of heat arising from IR reflow is also applied to non-defective semiconductor packages. Therefore, IR reflow can be carried out beyond the number of time of IR reflow prescribed for non-defective semiconductor packages. With respect to non-defective semiconductor packages, in this case, it cannot be assured that those semiconductor packages are non-defective.

In this case, with respect to semiconductor packages that are mounted over a mounting board and should be otherwise non-defective, it cannot be assured that they are non-defective. Eventually, therefore, all of them must be discarded together with the mounting board.

Conventional technologies pose a technical problem to be solved when a semiconductor package is mounted to a mounting board by solder. That is, it is impossible to dismount the once mounted semiconductor package and mount a different semiconductor package over the identical mounting board. Therefore, if a defective semiconductor package is produced in the processes of manufacturing and mounting semiconductor packages, it results in increase in cost.

A semiconductor package according to the invention includes: a package board including a coil that supplies power based on an induced current passed in response to change in magnetic flux; a pellet provided over the package board and including a circuit that operates based on power supplied from the coil; a protection member covering the package board and protecting at least the pellet; a first hole penetrating the protection member; and a second hole surrounded with a wiring forming the coil and penetrating the package board.

A semiconductor manufacturer who manufactures and sells semiconductor packages ships semiconductor packages having at least the above-mentioned configuration as a product. A customer supplied with these semiconductor packages from the semiconductor manufacturer carries out the following processing to mount semiconductor packages over a mounting board: a fixing member, for example, a magnetic material is passed through the first hole and the second hole in each semiconductor package. The mounting board over which the semiconductor packages are mounted is separately provided with a coil. This mounting board is provided with a hole (here, tentatively referred to as third hole) surrounded with a wiring forming this coil and penetrating the mounting board. Therefore, the customer supplied with the above-mentioned semiconductor packages passes the fixing member passed through the first and second holes provided in each semiconductor package also through the third hole and thereby fixes the semiconductor package over the mounting board. As an example, a configuration in which the following measure is taken is possible: the fixing member is passed through the third hole as well as the first and second holes and passed along side surfaces of the mounting board and each semiconductor package to form one closed loop; and the semiconductor package is thereby fixed over the mounting board. To configure this magnetic material in a closed loop, joints can be welded by heat. As another example, the magnetic material may be formed in an open loop in which part of the loop is discontinuous, not in a complete closed loop and each semiconductor package is thereby fixed over the mounting board. When the magnetic material is formed in an open loop, welding by heat is unnecessary and each semiconductor package is fixed over the mounting board by hooking it on the mounting board by the open-looped magnetic material. As a result, it is unnecessary for the customer to carry out IR reflow to mount the semiconductor packages over the mounting board.

To dismount one of the thus mounted semiconductor packages, IR reflow is unnecessary. That is, it is unnecessary to place them in a furnace together with the mounting board to apply heat to the entire semiconductor packages mounted over the mounting board. Specifically, the magnetic material fixing a semiconductor package to be dismounted over the mounting board only has to be mechanically cut. Therefore, it is unnecessary to apply heat to the semiconductor package that must be dismounted from the mounting board. In case of semiconductor packages mounted over a mounting board using a magnetic material configured in an open loop, welding by heat is not originally carried out. To dismount such a semiconductor package from the mounting board, therefore, the semiconductor package can be dismounted from the mounting board by changing the shape of the magnetic material by physical force. Consequently, it is possible to dismount a defective semiconductor package among multiple semiconductor packages mounted over a mounting board and instead mount a non-defective semiconductor package over this mounting board. As a result, when one of semiconductor packages mounted over a mounting board is defective, it is unnecessary to discard all of them together with the mounting board unlike conventional technologies.

When a semiconductor package is mounted over a mounting board as mentioned above, there is a concern about power supply to the semiconductor package. A circuit included in the semiconductor package mounted without use of solder balls is operated by supplying power from the mounting board to the semiconductor package by the principle described below:

The mounting board is provided with a power supply IC that supplies alternating-current voltage whose voltage value varies based on the frequency. When alternating-current voltage outputted from the power supply IC is applied to a coil provided in the mounting board, the current passed through this coil is also varied. In response to variation in the current passed through the coil provided in the mounting board, the magnetic flux produced by this coil also changes. Based on this change in magnetic flux, an induced current arising from the phenomenon of electromagnetic induction is passed through the coil included in the package board. In consideration of that, for example, recent circuits operate on direct-current voltage, power is supplied to a circuit included in the pellet of a semiconductor package by rectifying this induced current and the circuit operates. When the fixing member used to fix each semiconductor package over the mounting board is magnetic material, the magnetic material contributes to reduction of the amount of flux leakage and supply of a sufficient amount of power from the mounting board to each semiconductor package.

According to the foregoing, it is possible to dismount a defective semiconductor package among multiple semiconductor packages mounted over a mounting board; and instead mount a non-defective semiconductor package over this mounting board. This makes it possible to solve the following problem associated with conventional technologies: it is difficult to dismount a mounted semiconductor package and mount a different non-defective semiconductor package over the identical mounting board again.

According to the invention, it is possible to mechanically mount a semiconductor package over a mounting board without use of heat. Therefore, even though a defective semiconductor package is produced in product development, increase in cost can be suppressed.

DETAILED DESCRIPTION OF THE PREFERRED EMBODIMENTS

Hereafter, description will be given to embodiments of the invention disclosed in this specification with reference to the drawings. The scope of right of the invention is determined by the description in "What is claimed is" and should not be construed in a limited way by the following description of the embodiments.

First Embodiment

Figure 2:
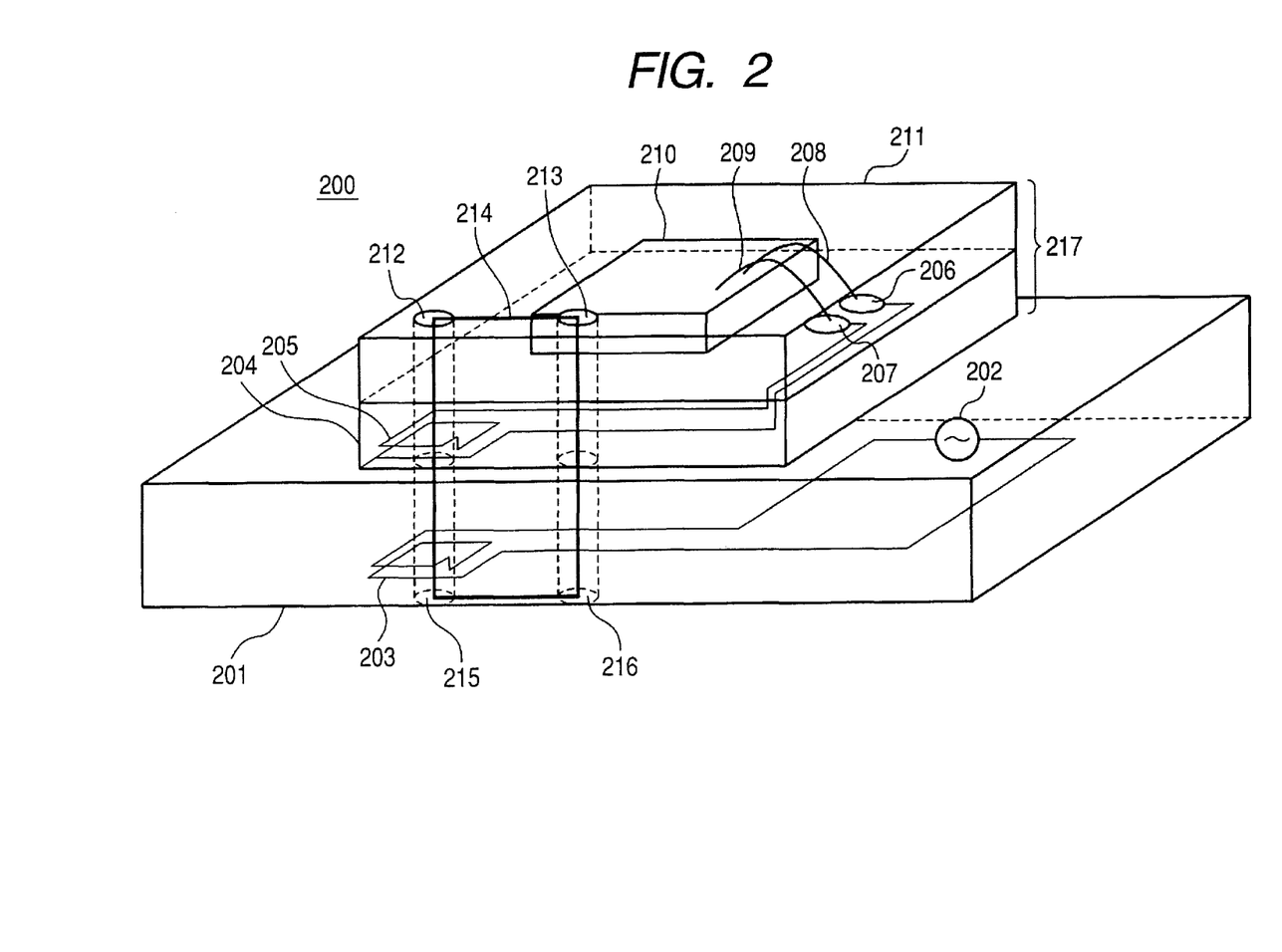
FIG. 2 is a drawing illustrating the configuration of a system in a first embodiment.

FIG. 2 illustrates a system 200 in the first embodiment. The system 200 is, for example, a system developed by an assembled product manufacturer supplied with semiconductor packages from a semiconductor manufacturer. The system 200 includes a mounting board 201. The mounting board 201 is a board used by the assembled product manufacturer to mount semiconductor packages supplied from the semiconductor manufacturer. The mounting board 201 includes a power supply IC, typified by a battery or the like, that converts externally supplied power into a predetermined voltage and outputs it. The mounting board 201 in this embodiment includes a power supply IC that outputs alternating-current voltage based on inputted voltage. FIG. 2 schematically illustrates this power supply IC as alternating-current voltage source 202. The power supply IC is essentially mounted over one main surface of the mounting board 201 but in FIG. 2, the power supply IC is schematically shown as alternating-current voltage source 202 inside the mounting board. The alternating-current voltage source 202 is coupled to a wiring extended in a wiring layer internal to the mounting board 201.

The mounting board 201 includes a coil 203. This coil 203 is formed using, for example, a wiring extended over the one main surface of the mounting board 201 or using a wiring extended in an internal wiring layer when the mounting board has a predetermined number of wiring layers therein. FIG. 2 illustrates an example in which the mounting board 201 is a multilayer board having multiple wiring layers therein. A first turn of the coil 203 is formed by a wiring extended in one wiring layer provided in the mounting board 201; and a second turn of the coil 203 is formed by a wiring extended in a wiring layer different from the one wiring layer. That is, in this example in FIG. 2, the number of turns of the coil 203 is two. In cases where the mounting board 201 has more than two wiring layers, the number of turns of the coil 203 can be further increased similarly using the following wirings: wirings extended in wiring layers respectively different from the wiring layers where the wirings for the first and second turns of the coil 203 are located. This coil 203 is coupled to the alternating-current voltage source 202 that outputs alternating-current voltage and has alternating-current voltage inputted thereto.

In the mounting board 201, there are a hole 215 surrounded with a wiring forming the coil 203 and penetrating the mounting board and a hole 216 provided separately from the hole 215 and penetrating the mounting board 201. A fixing member, for example, a magnetic material (a representative example is an iron core) is passed through these holes 215 and 216 and this will be described in detail later. Though two holes, the hole 215 and the hole 216, are provided in this example, the number of holes may be one as described later.

Over the one main surface of the mounting board 201, there is provided a package board 204. The package board 204 is a board for the semiconductor manufacturer to place a pellet 210, or a semiconductor chip in which a circuit for implementing desired functions is formed. Similarly with the mounting board 201, the package board 204 has a predetermined number of wiring layers therein and in each wiring layer, a wiring formed of metal is extended. The package board 204 in this embodiment includes a coil 205. This coil 205 is formed by, for example, a wiring extended in a wiring layer provided in the package board 204. Specifically, a first turn of the coil 205 is formed by a wiring extended in one wiring layer provided in the package board 204; and a second turn of the coil 205 is formed by a wiring extended in a wiring layer different from the one wiring layer. That is, in this example in FIG. 2, the number of turns of the coil 205 is two. In cases where the package board 204 has more than two wiring layers, the number of turns of the coil 205 can be further increased similarly using the following wirings: wirings extended in wiring layers respectively different from the wiring layers where the wirings for the first and second turns of the coil 205 are located.

Over the package board 204, there are provided electrode pads 206 and 207. The coil 205 is coupled with the electrode pads 206 and 207. Over the package board 204, there is provided a semiconductor chip in which a circuit for implementing desired functions is formed, that is, a pellet 210. The electrode pads 206 and 207 and the circuit formed in the pellet 210 are electrically coupled together through bonding wires 208, 209 and electrode pads (not shown) formed in the pellet 210. Therefore, the coil 205 and the circuit formed in the pellet 210 are electrically coupled together. In the above-mentioned example, the coil 205 is electrically coupled with the circuit included in the pellet 210 through the bonding wires. However, the coupling between the coil 205 and the circuit included in the pellet 210 is not limited to this example. When the pellet 210 and the package board 204 are flip-chip bonded together, for example, the above-mentioned bonding wire 208 is not used. In this case, the circuit included in the pellet 210 is coupled through solder balls or the like and when these solder balls or the like are bonded with a wiring layer provided in the package board 204, the coil 205 and the circuit included in the pellet 210 are electrically coupled together.

One main surface of the package board 204 where the pellet 210 is formed is covered with a protection member 211 that protects at least the pellet 210. The protection member 211 is composed of, for example, molding resin. In this embodiment, the objects, such as the pellet 210, bonding wire 208, and electrode pads 206 and 207, to be protected formed in the one main surface are protected by this protection member 211. In cases where the protection member 211 is formed of molding resin, the objects, such as the electrode pads 206 and 207, to be protected formed in the one main surface are sealed with the protection member 211 formed of molding resin.

In the example in FIG. 2, at least the following holes are respectively present in the protection member 211 and the package board 204: a first hole penetrating the protection member 211 and a second hole surrounded with a wiring forming the coil 205 and penetrating the package board 204. Since FIG. 2 illustrates an embodiment, however, a hole 212 is depicted as a more detailed concrete example in the drawing. The hole 212 is obtained by aligning the first hole and the second hole with each other and connecting the first and second holes together and penetrates the protection member 211 and the package board 204. FIG. 2 is depicted on the assumption that there is a hole 213 provided separately from the hole 212 and penetrating the protection member 211 and the package board 204. The hole 213 may be divided into a hole penetrating the protection member and a hole penetrating the package board. A fixing member, for example, a magnetic material (a representative example is an iron core) is passed through the holes 212 and 213 and this will be described in detail later. The hole 212 is aligned so that it connects with the hole 215 and the hole 212 and the hole 215 together form one hole penetrating the protection member 211, package board 204, and mounting board 201. This is the same with the hole 213 and the hole 216. In this example in FIG. 2, two holes are provided as the hole 212 and the hole 213; however, the number of holes penetrating the package board 204 and the protection member 211 may be one as described later.

The semiconductor manufacturer ships a semiconductor package 217 including at least the following to a customer as a product: the package board including the coil 205; the pellet 210 provided over the package board 204 and having a circuit for implementing desired functions formed therein; the protection member 211 covering the package board 204 and sealing at least the pellet 210; the hole 212 surrounded with a wiring forming the coil 205 and penetrating the protection member 211 and the package board 204; and the hole 213 provided separately from the hole 212 and penetrating the protection member 211 and the package board 204. This semiconductor package 217 may include another constituent element, for example, a necessary object such as an electrode pad and a bonding wire, needless to add.

The customer, for example, an assembled product manufacturer who purchased this semiconductor package 217 need mount this semiconductor package 217 over the mounting board 201. Consequently, the assembled product manufacturer passes a fixing member, specifically, a magnetic material for fixing the semiconductor package 217 over the mounting board 201 through the following: the holes 212 and 213 provided in the package board 204 of the purchased semiconductor package 217 and the holes 215 and 216 provided in the mounting board 201. The assembled product manufacturer forms this fixing member in a desired shape and fixes, that is, mounts the semiconductor package 217 over the mounting board 201. When the fixing member is a magnetic material, the configuration of the system 200 is preferable in terms of power supply to the circuit included in the pellet 210 described later. A possible example of the fixing member is such a magnetic material 214 in a closed loop as illustrated in FIG. 2. In this case, the magnetic material 214 runs from the upper surface of the protection member 211, goes through the hole 212 and the hole 215, and is extended to the lower surface of the mounting board 201. Thereafter, the magnetic material 214 is extended in the lower surface of the mounting board 201, goes through the hole 216 and the hole 213, and reaches the upper surface of the protection member 211. Further, the magnetic material 214 is extended in the upper surface of the protection member 211 and reaches the hole 212. As a result, the magnetic material 214 forms a closed loop. When the fixing member is such a magnetic material as a ferrite core, welding by heat is required to form the magnetic material in a closed loop. Therefore, the assembled product manufacturer uses a required apparatus to carrying welding to form the closed-looped magnetic material 214. The magnetic material as the fixing member for fixing the semiconductor package 217 over the mounting board 201 need not be formed in a closed loop. Instead, it may be formed in an open loop in which part of the magnetic material 214 shown in FIG. 2 is discontinuous and interrupted. Also in this case, the semiconductor package 217 can be fixed over the mounting board 201 unless the gap portion of the magnetic material in an open loop is too large. In addition, when this open-looped magnetic material is used, necessity for welding by heat is obviated.

Figure 3:
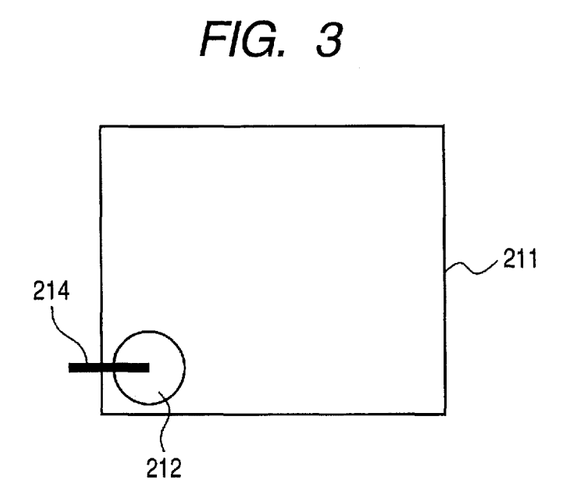
FIG. 3 is a drawing illustrating a modification to the first embodiment.
Figure 4:
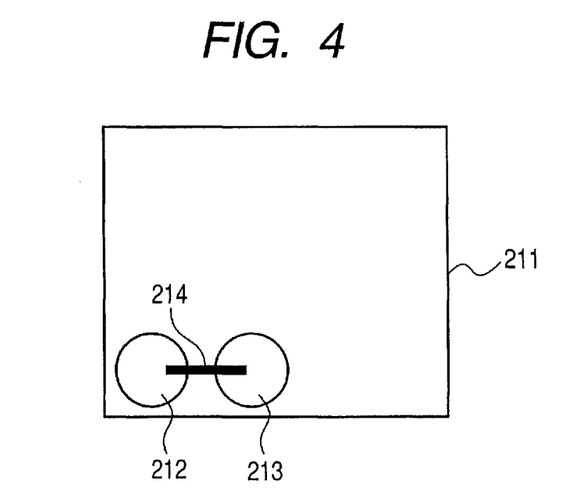
FIG. 4 is a drawing illustrating a modification to the first embodiment.
Figure 5:
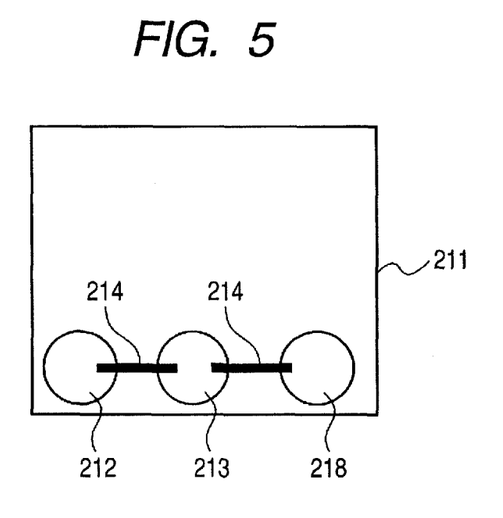
FIG. 5 is a drawing illustrating a modification to the first embodiment.
Figure 6:
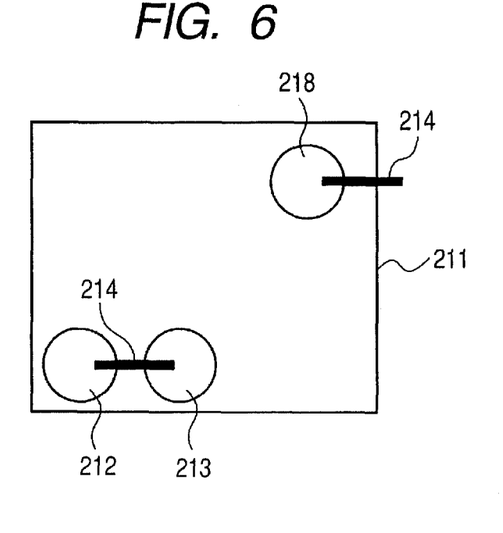
FIG. 6 is a drawing illustrating a modification to the first embodiment.

When the above-mentioned mounting is completed, the system 200 illustrated in FIG. 2 is obtained. However, the configuration of the system 200 is not limited to that illustrated in FIG. 2 and includes various modifications. FIG. 3 to FIG. 6 schematically explain modifications to the configuration of the system 200 based on top views of the protection member 211 in FIG. 2. To fix the semiconductor package 217 over the mounting board 201, at least one hole only has to exist as illustrated in FIG. 3, for example. In this case, the fixing member 214 runs from the upper surface of the protection member 211, is extended in the hole 212 and penetrates the package board 204, and is extended in the hole 215 and penetrates the mounting board 201. The fixing member 214 further goes along the lower surface of the mounting board 201, a side surface of the mounting board 201, a side surface of the package board 204, and a side surface of the protection member 211. Then it is extended to the upper surface of the protection member 211. As a result, the fixing member 211 forms a closed loop. In the example in FIG. 3, the fixing member 214 need not be a closed loop and may be an open loop as mentioned above. FIG. 4 is a top view of the protection member 211 in FIG. 2. In addition to the holes 212 and 213, more holes may be provided in the semiconductor package 217. As illustrated in FIG. 5, for example, three holes, that is, the holes 212, 213, 218 may be provided along one side of the protection member 211. The mounting board 201 is also provided with a hole penetrating the mounting board 201 in correspondence with the hole 218. As illustrated in FIG. 6, the following measure may be taken: the holes 212 and 213 are provided along one side of the protection member 211; and the additional hole 218 penetrating the protection member 211 and the package board 204 is provided in proximity to the side opposite the one side. In this case, the semiconductor package 217 is fixed over the mounting board 201 at three points; therefore, it can be more firmly fixed.

The wiring forming the coil 205 may surround the hole 213 as well as the hole 212. This configuration is effective in increasing the number of turns of the coil 205. As mentioned above, one turn of the coil 205 is formed in each wiring layer provided in the package board 204. For this reason, there may be the following cases even when it is desired to make the number of turns of the coil 205 larger than the number of the wiring layers provided in the package board 204: the number of turns of the coil 205 cannot be made larger than the number of the wiring layers provided in the package board 204 just by ensuring that the wiring forming the coil 205 surrounds only the hole 212.

Consequently, the wiring forming the coil 205 is routed so as to surround the hole 213. This makes it possible to achieve a number of turns twice the number of the wiring layers provided in the package board 204. To simply increase a number of turns, it is unnecessary to form a wiring so that it surrounds the hole 213. In consideration of flux leakage, described later, that occurs during power supply, however, it is desirable to ensure that the wiring for the coil 205 surrounds the hole 213.

As mentioned above, the semiconductor package 217 can be mounted over the mounting board 201 without carrying out IR reflow on solder balls. The circuit included in the pellet 210 of the semiconductor package 217 does not operate unless sufficient power is supplied to the circuit. Consequently, consideration will be given to the validity of power supplied to this circuit in this embodiment.

First, alternating-current voltage having a predetermined frequency is applied from the alternating-current voltage source 202 to the coil 203. Since the current passed through the coil 203 varies with a certain frequency, the magnetic flux produced by the coil 203 also changes in response to change in the current passed through the coil 203. The variation in the magnetic flux produced by the coil 203 produces induced electromotive force in the coil 205 based on the phenomenon of electromagnetic induction. Based on this induced electromotive force produced in response to the change in the magnetic flux produced by the coil 203, an induced current is passed through the coil 205. This induced current flows into the power supply line formed in the pellet 210 and the circuit is supplied with power. The circuit formed in the pellet 210 operates based on this power. The magnitude of induced electromotive force produced in the coil 205 varies according to the number of turns of the coil 203 and the number of turns of the coil 205. To obtain a desired voltage, therefore, the number of turns of the coil 203 and the number of turns of the coil 205 only have to be adjusted. It is unnecessary to provide a step-up circuit or a step-down circuit for converting voltage values. Since recent circuits formed in the pellet 210 operate on direct-current voltage, however, it is required to take the following measure in actual designing: any of the semiconductor packages 217 is provided with a rectification circuit.

The induced electromotive force produced in the coil 205 is also influenced by the amount of flux leakage that does not interlink with the coil 205 in the magnetic flux produced by the coil 203. When the coil 203 and the coil 205 are ideally coupled together and the coupling coefficient is 1, flux leakage does not occur. Since in reality, this coupling coefficient cannot be 1, however, it is required to take reduction in induced electromotive force due to flux leakage as well into account in real designing. This is because when the induced electromotive force is reduced, power that can be supplied to the pellet 210 is also reduced. Consequently, the measure illustrated in FIG. 2 as well is taken to reduce the amount of flux leakage as much as possible. That is, the magnetic material 214, for example, an iron core, adopted as the fixing member is passed through the hole 212 and the hole 213. The magnetic material 214 assumes a role of a fixing member that fixes and mounts the semiconductor package 217 over the mounting board 201. In addition, it also assumes a role of reducing the amount of flux leakage in the magnetic flux produced from the coil 204 to ensure the certain magnitude of induced electromotive force of the coil 205.

Even though the magnetic material 214 is passed as mentioned above, flux leakage is also caused by the following: a gap produced between the magnetic material 214 and the coil 203 and a gap produced between the magnetic material 214 and the coil 205. In reality, therefore, the loss of induced electromotive force is inevitable even with the magnetic material 214 provided. However, the loss of induced electromotive force can be largely suppressed by using a magnetic material 214, for example, a ferrite core sufficiently high in magnetic permeability to fix the semiconductor package 217 over the mounting board 201. This is because most of the magnetic flux produced by the coil 203 goes through the magnetic material 214 and interlinks with the coil 205. In this case, it is possible to disregard a gap between the coil 203 and the magnetic material 214 and a gap between the coil 205 and the magnetic material 214.

Even though the above contrivance is made in an attempt to suppress reduction in induced electromotive force and ensure power that can be supplied to the pellet 210, the following takes place when the system 200 is actually designed: power that can be transmitted to the pellet 210 is lost by the impedance of the coil 205 itself. In reality, as mentioned above, it is required to provide a semiconductor package 217 with a rectification circuit; therefore, it is required to also take the loss of power due to this rectification circuit into account. Further, power may be lost by eddy current depending on the shape of the coil 205. The hysteresis loss of this power must also be taken into account.

In consideration of the foregoing, it is appropriate to suppose that several tens of percent of power inputted to the coil 203 in the mounting board 201 is lost in real designing.

Meanwhile, recent circuits formed in the pellet 210 operate based on a direct-current voltage of 1 V or so supplied to the power supply line provided in the pellet 210. Even though power based on the voltage outputted by the alternating-current voltage source 202 is lost several tens of percent or so before it is supplied to the circuit included in the pellet 210, it is supposed that: a direct-current voltage of 1 V or so can be sufficiently supplied to the power supply line provided in the pellet 210 by setting the peak-to-peak value of alternating-current voltage supplied by the alternating-current voltage source 202 to 2 V or so.

The foregoing is a restriction imposed on the following when the coil 203 and the coil 205 are configured as a transformer and power is supplied from the mounting board 201 to the circuit formed in the pellet 210: the value of voltage supplied by the alternating-current voltage source 202 taken into account when the system 200 is actually designed. Even though the restriction on the voltage value is met, however, a structural restriction must also be met to actually implement the system 200. In the system 20 in FIG. 2, it is of a problem whether or not the structure of the coil 203, coil 205, and magnetic material 214 is realistic in supplying power to the pellet 210. (This is because when the cross-sectional area of the magnetic material is realistic, the cross-sectional area of a hole through which the magnetic material 214 is passed is also realistic.)

Consequently, consideration will be given to structural restrictions on the coil 203, coil 205, and magnetic material 214. A structural restriction on the coil 203 and the coil 205 is their number of turns required to supply required power to the circuit formed in the pellet 210. The reason for this is as follows. When the magnetic material 217, for example, a ferrite core sufficiently high in magnetic permeability is used to fix the semiconductor package 214 over the mounting board 201, the following takes place: the magnetic flux produced by the coil 203 is almost all passed through the magnetic material 214 and interlinks with the coil 205. Therefore, a gap between the coil 203 and the magnetic material 214 and a gap between the coil 205 and the magnetic material 214 can be disregarded. Thus, when a number of turns is too large as compared with the number of wiring layers provided in the mounting board 201 or the package board 204, the following takes place: even when the alternating-current voltage source 202 outputs alternating-current voltage whose peak-to-peak value is 2V, sufficient power cannot be supplied to the circuit included in the pellet 210 with the coil 203 or coil 205 formed using a wiring extended in the wiring layer. This is because in consideration of that the system 200 is actually mounted over a small produce, it is not realistic to take the following measure: the number of the wiring layers in the package board 204 or the mounting board 201 is increased to make the package board 204 or the mounting board 201 too thick.

A possible structural restriction on the magnetic material 214 is the cross-sectional area and length of the magnetic material 214. The induced electromotive force produced in the coil 205 is based on change in magnetic flux interlinked with the coil 205. Mathematically, it is based on the amount of change per unit time in the density of magnetic flux interlinked with the coil 205 as according to Faraday's law. As mentioned above, the magnetic flux produced by the coil 203 substantially goes through the magnetic material 214 and interlinks with the coil 205. In consideration of these, the cross-sectional area of the magnetic material 214 relates to magnetic flux density and is thus important. With respect to the length of the magnetic material 214, meanwhile, it can be supposed from the above viewpoint that it only has to be the extent that the semiconductor package 217 can be fixed over the mounting board 201.

So, it turns out that consideration must be given to the numbers of turns of the coil 203 and the coil 205 and the cross-sectional area of the magnetic material 214. It is known from an analysis of a transformer that the maximum density Bm of magnetic flux that can be passed through the magnetic material 214, for example, an iron core is $Bm=V/(\sqrt{2}\pi*f*S*N)$, where $\pi$ is circumference ratio; f is the frequency of alternating-current voltage; S is the cross-sectional area of the magnetic material 214, for example, an iron core; and N is the number of turns of a coil wound around the iron core (for example, the number of turns of each of the coil 203 and the coil 205 when the coil 203 and the coil 205 are identical in number of turns). Here, 3.14 will be taken as the circumference ratio $\pi$ and 2V, which is the peak-to-peak value of voltage outputted by the alternating-current voltage source 202, will be substituted for V. 2 $GHz=2*10^9$, which is a typical frequency at which the oscillation of voltage is actually achieved, will be substituted for the frequency f of alternating-current voltage.

The rest is the cross-sectional area of the magnetic material 214 and the maximum magnetic flux density Bm. When these values are determined, the number of turns N of each of the coil 203 and the coil 205 is determined from the above expression. This N refers to the number of turns N obtained when the maximum magnetic flux density is passed through the magnetic material 214 and this means that a number of turns not less than N is required. As an example, it will be assumed that a ferrite core is used as the magnetic material 214. In this case, Bm is 0.5 T or so and 0.5 is substituted for Bm. On the assumption that the cross section of the iron core is, for example, a square measuring 1 mm per side, $1.0*10^{-6}$ square meters is adopted for the cross-sectional area of the iron core. In this case, the cross section of the iron core is sufficiently smaller than the area of the upper surface or lower surface of the protection member 211 or package board 204 of the semiconductor package 217. Therefore, the opening area of the hole 212, hole 213, hole 215, or hole 216 does not become larger than necessary. In the semiconductor package 217 illustrated in FIG. 2, specifically, for example, the thickness of the protection member 211 is 200 μm and the length of longitudinal sides and the length of horizontal sides are each 10 mm or so. Naturally, this is also the case with the package board 204.

Therefore, in an example in which the cross-sectional area of the iron core is $1.0*10^{-6}$ square meters, the structure of the actual system 200 is not unrealistically restricted even with the size of the protection member 211 or the package board 204 taken into account.

Using the numeric values in the above example, the minimum number of turns N required for the coil 203 and the coil 205 to implement the following will be determined: the circuit formed in the pellet 210 is operated by supplying alternating-current voltage whose peak-to-peak value is 2V from the alternating-current voltage source 202.

When the number of turns N is actually calculated, $N>V/(\sqrt{2}*\pi*f*S*Bm)=2/(4.44*2*10^9*1*10^{-6}*0.5)=0.45*10^{-3}$. That is, the number of turns only has to be 1 at least. Therefore, it is supposed that a larger-than-necessary number of turns is not necessary for the coil 203 or the coil 205.

It is understood from the foregoing that the system 200 in this embodiment has an appropriate structural size in terms of real design and is realistic in terms of technology. According to this embodiment, therefore, it is possible to adopt a structure that enables the practical manufacture of products and mount the semiconductor package 217 over the mounting board 201 without carrying out IR reflow on solder balls. Further, it is possible to supply sufficient power to the circuit included in the pellet 210 of the semiconductor package 217 to operate the circuit.

Description will be given to a manufacturing method for this system 200. The wiring pattern of wirings extended in the wiring layers provided in the package board 204 is designed so that the coil 205 is formed in a desired position in the package board 204 of the semiconductor package 217. Then the package board 204 with this coil 205 formed therein is prepared. Required constituent elements, such as the pellet 210, are formed thereover using publicly known manufacturing techniques and the pellet 210 and the like are sealed with the protection member 211. Subsequently, the hole 212 penetrating the protection member 211 and the package board 204 is formed by drilling so that it is surrounded with the wiring forming the coil 205 based on the position where the coil 205 is formed. At the same time, the hole 213 is formed by drilling so that it penetrates the protection member 211 and the package board 204. As a result, the semiconductor package 217 is manufactured. As mentioned above, the semiconductor manufacturer ships the thus formed semiconductor packages 217 to the customer. The customer designs the wiring pattern of wirings extended in the wiring layers provided in the mounting board 201 so that the coil 203 is also formed in the mounting board 201. Then the customer prepares a mounting board with the coil 203 formed therein. The hole 215 penetrating the mounting board 201 is formed by drilling so that it is surrounded with the wiring forming the coil 203 based on the position where the coil 203 is formed. At the same time, the hole 216 is formed by drilling so that it penetrates the mounting board 201. Thereafter, the customer aligns each semiconductor package and mounts each semiconductor package 217 over the mounting board 201 by the above-mentioned technique and the system 200 is thereby formed.

Second Embodiment

Figure 7:
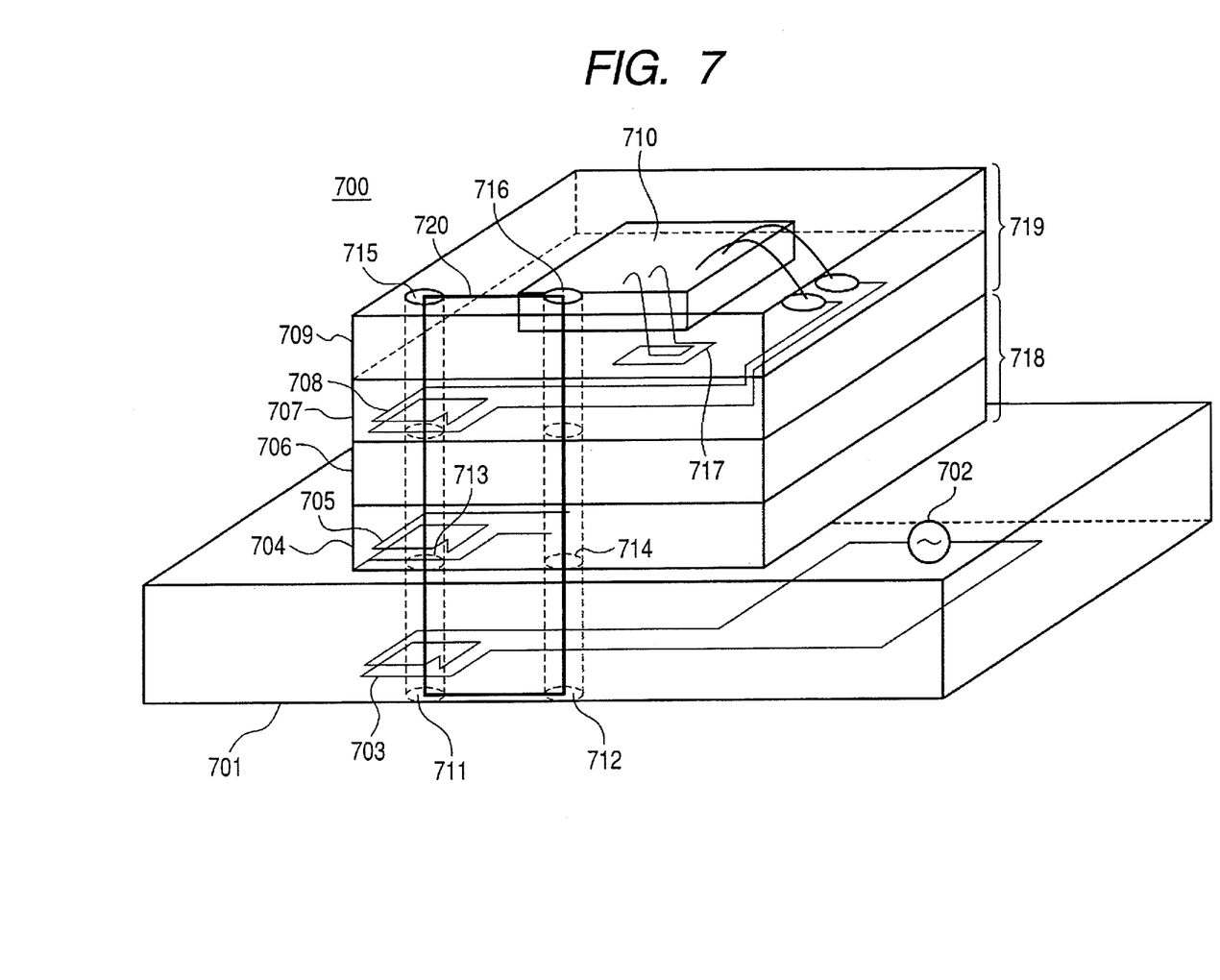
FIG. 7 is a drawing illustrating the configuration of a system in a second embodiment.

Description will be given to the second embodiment. FIG. 7 illustrates a system 700 in the second embodiment of the invention disclosed in this specification. It is different from the first embodiment in that: multiple semiconductor packages, that is, a first semiconductor package 718 and a second semiconductor package 719 are stacked over a mounting board 701; the second semiconductor package 719 has an antenna 717 and though not shown in the drawing, the first semiconductor package also has the same antenna as the antenna 717. Hereafter, concrete description will be given to the configuration of the system 700. Portions overlapping with the content of the description of the first embodiment will be omitted as appropriate.

As in the first embodiment, the mounting board 701 is provided with a coil 703, which is supplied with alternating-current voltage from an alternating-current voltage source 702. As in the first embodiment, further, holes 711 and 712 are formed.

Over the mounting board 701, the first semiconductor package 718 is formed. The first semiconductor package 718 includes a package board 704. This package board 704 has a coil 705 formed therein as in the first embodiment and though not shown in the drawing, a pellet that operates with power supplied is also provided over the package board. Though not shown in the drawing, constituent elements, such as a bonding wire, required for electrical coupling between the pellet and the coil 705 are also provided in the package board 704. Unlike the first embodiment, however, the same antenna as the above-mentioned antenna 717 is provided over the package board 704 and this antenna is coupled to the circuit included in the pellet formed in the package board 704. This antenna wirelessly radiates and transmits signals from the pellet and outputs received signals to the circuit included in the pellet. This antenna is, for example, a planar spiral antenna formed of a wiring extended over the package board 704. A protection member 706 sealing the pellet and the antenna is provided over the package board 704. As in the first embodiment, holes 713 and 714 are formed and the holes 713 and 714 connect with the holes 711 and 712 as the result of alignment; therefore, holes penetrating the protection member 706, package board 704, and mounting board 701 are formed. As in the first embodiment 1, the hole 713 is divided into a first hole penetrating the protection member and a second hole surrounded with a wiring forming the coil 705 and penetrating the package board 704. Similarly, the hole 714 is also divided into two holes.

Over the protection member 706 included in the first semiconductor package 718, the package board 707 included in the second semiconductor package 719 is provided. The package board 707 is also provided with a coil 708 similarly with the package board 704 of the first semiconductor package 718. This coil 708 is coupled to a pellet 710 provided over the package board 707. As a result, the circuit formed in the pellet 710 and the coil 708 are electrically coupled together. Unlike the first embodiment, the antenna 717 is provided over the package board 707. This antenna 717 is coupled to the circuit included in the pellet 710 formed in the package board 707. This antenna 717 wirelessly radiates and transmits signals form the pellet 710 and outputs received signals to the circuit included in the pellet 710. This antenna 717 is, for example, a planar spiral antenna formed of a wiring extended over the package board 707. A protection member 709 sealing the pellet 710 and the antenna 717 is provided over the package board 707. As in the first embodiment, holes 715 and 716 are formed and the holes 715 and 716 connect with the holes 713 and 714 by alignment. As a result, the holes 715 and 716 also connect with the holes 711 and 712 in the mounting board 701. Therefore, one can argue that holes penetrating the protection member 709, package board 707, protection member 706, package board 704, and mounting board 701 are formed. As in the first embodiment, the hole 715 is divided into two holes, a hole penetrating the protection member 709 and a hole surrounded with a wiring forming the coil 708 and penetrating the package board 707. The hole 716 is also divided into a hole penetrating the protection member 709 and a hole penetrating the package board 707.

As in the first embodiment, a fixing member, for example, a magnetic material 720 is passed through the holes 711 and 712, 713 and 714, and 715 and 716; and the first semiconductor package 718 and the second semiconductor package 719 are mounted over the mounting board 701. When a magnetic material is adopted as the fixing member, the magnetic material 720 is, for example, a ferrite core as in the first embodiment.

In the second embodiment, the first semiconductor package 718 and the second semiconductor package 719 are used to implement the system 700. For this reason, it is required to electrically couple together the circuit included in the pellet of the first semiconductor package 718 and the circuit included in the pellet 710 of the second semiconductor package 719. This is because: when this electrical coupling is achieved, electrical signals can be communicated between the circuit included in the pellet of the first semiconductor package 718 and the circuit included in the pellet 710 of the second semiconductor package 719; and thus a system for achieving desired functions is built.

In the second embodiment, consequently, the circuit included in the pellet of the first semiconductor package 718 and the circuit included in the pellet 710 of the second semiconductor package 719 are electrically coupled together by taking the following measure: the antenna provided in the first semiconductor package 718 and the antenna 717 provided in the second semiconductor package are caused to wirelessly communicate with each other. More specific description will be given. The antenna provided in the first semiconductor package 718 radiates signals from the circuit included in the pellet provided in the first semiconductor package 718 and transmits them to the antenna 717 of the second semiconductor package 719. The antenna 717 receives signals from the antenna provided in the first semiconductor package 718 and outputs the received signals to the circuit included in the pellet 710.

Similarly, the antenna 717 receives and radiates signals from the circuit included in the pellet 710 and outputs them to the antenna provided in the first semiconductor package 718. The antenna outputs the signals received from the antenna 717 to the circuit included in the pellet provided in the first semiconductor package 718.

Thus signals are communicated between the first semiconductor package 718 and the second semiconductor package 719. Since signals are wirelessly communicated between the antennas, it is required that the signals outputted from these antennas should have a frequency with which wireless communication is enabled. For example, the signals are required to have a frequency of 2 GHz or so, which is used in wireless LAN, Bluetooth, and the like. Non-patent Document 2 mentioned above describes that spiral antennas 240 μm square can carry out wireless communication within a range of up to 120 μm using a frequency of 1.2 GHz or so. Consequently, consideration will be given to the following based on the thickness of each member forming recent semiconductor packages: the size of each of the antenna 717 in the system 700 illustrated in FIG. 7 and the antenna included in the first semiconductor package 718.

In FIG. 7, the thickness of each of the package board 704 and the package board 707 is, for example, 300 μm. The thickness of each of the pellet included in the first semiconductor package 718 and the pellet 710 included in the second semiconductor package 719 is 120 μm. The thickness of each of the protection member 706 and the protection member 709 is 200 μm. The antenna included in the first semiconductor package 718 is formed over the package board 704 and the antenna 717 included in the second semiconductor package 719 is formed over the package board 707. Thus the distance between these antennas is shortest when they are vertically opposed to each other and the shortest distance is 500 μm, which is the sum of the thickness of the protection member 706 and the thickness of the package board 707. As mentioned above, Non-patent Document 1 discloses that spiral antennas 240 μm square can carry out wireless communication within a range of up to 120 μm using a frequency of 1.2 GHz or so. In consideration of this, wireless communication can be carried out when each of the antenna included in the first semiconductor package 718 and the antenna 717 included in the second semiconductor package 719 is a spiral antenna approximately 1000 μm square.

When these antennas are not so arranged that they are vertically opposed to each other, the distance between the antennas is increased and thus it is required to increase the size of each antenna. As described in relation to the first embodiment, however, the package boards 704, 707 and the protection members 706, 709 are each 10 mm in longitudinal length and in horizontal length. Therefore, it is supposed that increase in the size of the spiral antenna provided in each semiconductor package can be sufficiently coped with. Therefore, one can argue that this embodiment can be technically implemented.

FIG. 7 illustrates an example in which the two semiconductor packages are stacked and mounted over the mounting board 701. However, the number of the semiconductor packages stacked over the mounting board 701 may be greater than two. For example, a third semiconductor package may be additionally stacked over the second semiconductor package 719 in FIG. 7. In this case, a flat spiral antenna is also provided over the package board of the third semiconductor package. The antenna included in the third semiconductor package wirelessly communicates with the antenna included in the first semiconductor package 718 and the antenna 717 included in the second semiconductor package 719. However, when the antenna included in the third semiconductor package and the antenna included in the first semiconductor package are caused to wirelessly communicate with each other, the distance between the two antennas is increased. For this reason, there is a possibility that direct wireless communication cannot be carried out between the two antennas depending of the size of these antennas. In this case, for example, the following measure can be taken: signals are once transmitted to the antenna 717 included in the second semiconductor package 719 and their intensity is amplified at the amplifier circuit provided in the second semiconductor package 719; and then the signals are transmitted from the antenna provided in the second semiconductor package 719 to the antenna included in the first semiconductor package 718.

Third Embodiment

Figure 8:
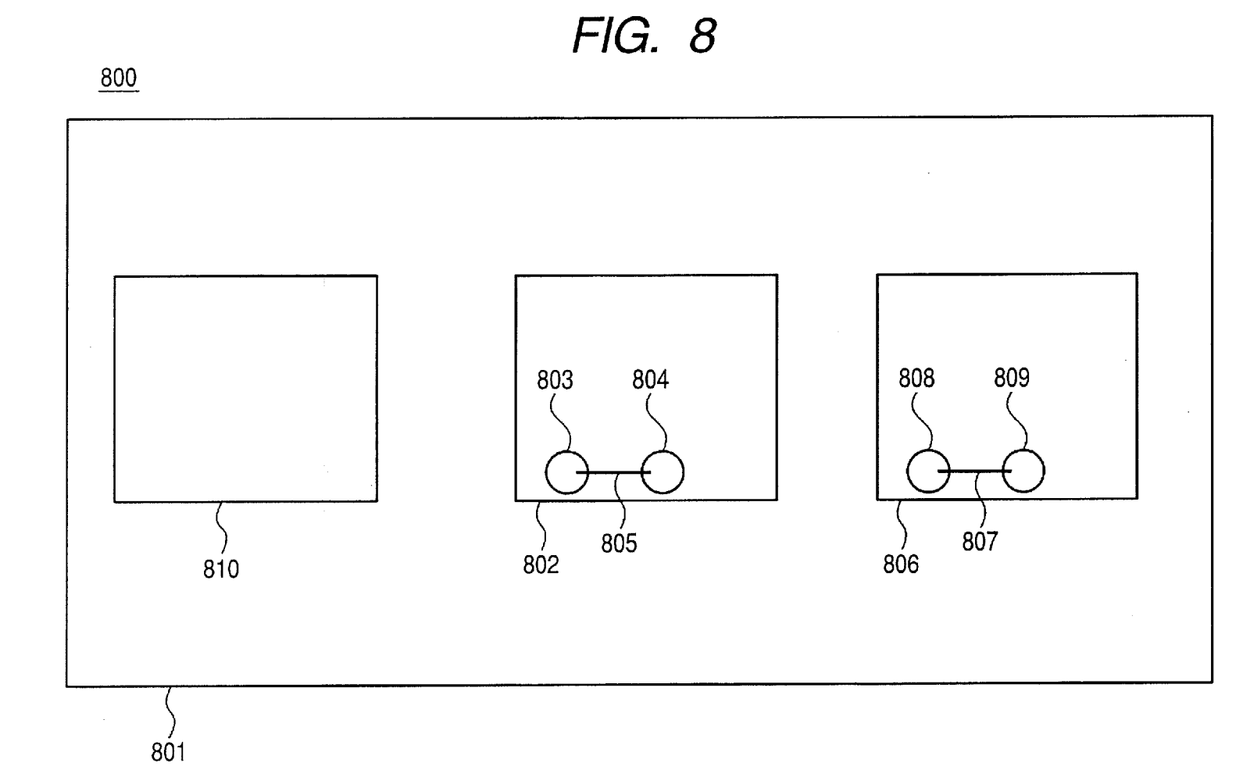
FIG. 8 is a drawing illustrating the configuration of a system in a third embodiment.

FIG. 8 illustrates the configuration of a system 800 in the third embodiment. Hereafter, the description of constituent elements overlapping with the above description will be omitted. FIG. 8 is a top view of the system 800. In the example in FIG. 8, multiple semiconductor packages are mounted over a mounting board 801. In this top view, the respective semiconductor packages are indicated by a protection member 802, a protection member 806, and a protection member 810. In the third embodiment, as seen from FIG. 8, the multiple semiconductor packages are mounted over the plane of one main surface of the mounting board 801 unlike the second embodiment. Similarly with the protection member 709 in the second embodiment, the protection member 802 protects a pellet and the like provided over a package board though they are not shown in the drawing. A hole 803 and a hole 804 are formed in the upper surface of the protection member 802 and penetrate the protection member 802 and the package board, not shown. In the mounting board 801, holes penetrating the mounting board 801 are provided in positions corresponding to the hole 803 and the hole 804. The semiconductor package including the protection member 802 is fixed over the mounting board 801 by a fixing member 805 passed through these holes.

Similarly with the protection member 709 in the second embodiment, the protection member 806 also protects a pellet and the like provided over a package board though they are not shown in the drawing. In the example in FIG. 8, therefore, a hole 808 and a hole 809 are formed in the upper surface of the protection member 806 and penetrate the protection member 806 and the package board, not shown. In the mounting board 801, holes penetrating the mounting board 801 are provided in positions corresponding to the hole 808 and the hole 809. The semiconductor package including the protection member 806 is fixed over the mounting board 801 by a fixing member 807 passed through these holes.

Figure 9:
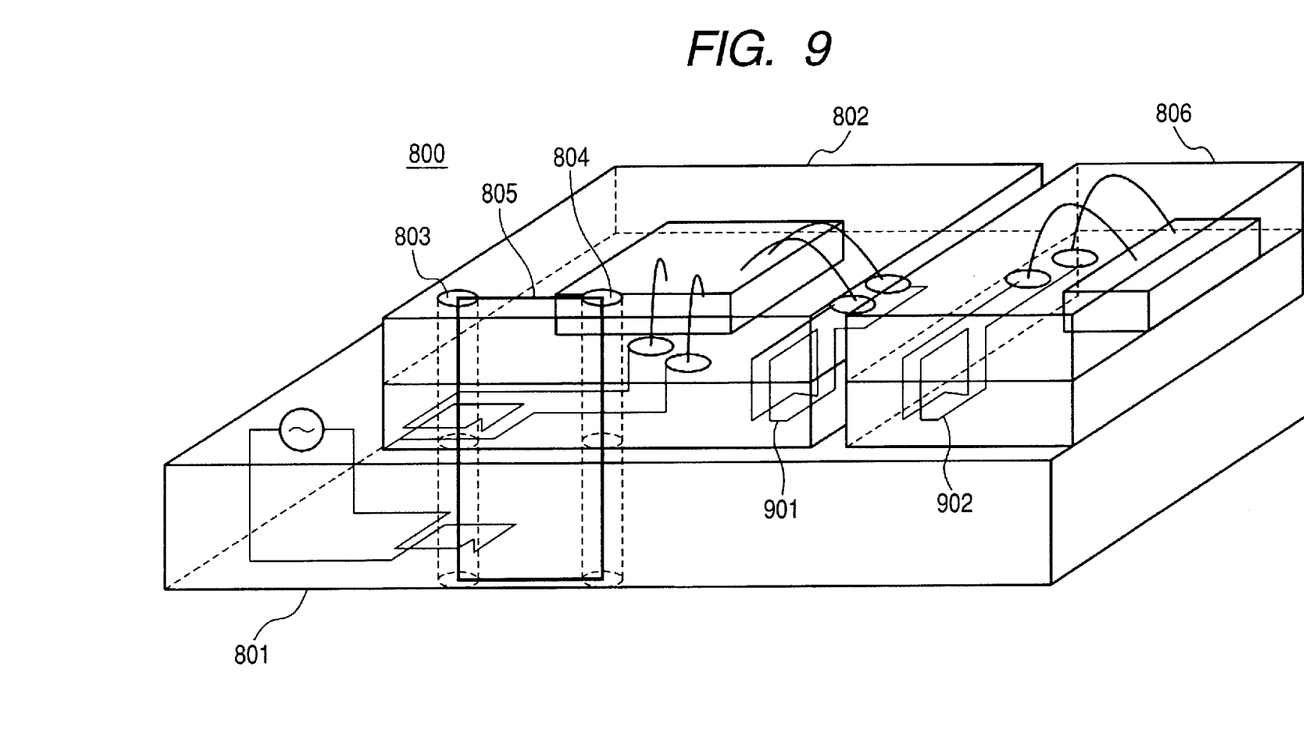
FIG. 9 is a drawing illustrating a system in the third embodiment.

In the package boards corresponding to the protection member 802 and the protection member 806, antennas different in shape from those in the second embodiment are provided. More specific description will be given. In the third embodiment, such antennas 901 and 902 as illustrated in FIG. 9 are provided. In FIG. 9, the holes 808, 809 of the semiconductor package including the protection member 806 and the fixing member 807 are omitted. In actuality, however, the semiconductor package including the protection member 806 has the holes 808 and 809 formed therein and is provided with the fixing member 807 as illustrated in FIG. 8. In this case, similarly with the embodiments described up to this point, the semiconductor package including the protection member 806 is provided in its package board with a coil. This coil is so provided that it surrounds the fixing member 807 passed through the hole 808 and the hole 809. Also in the mounting board, there is provided a separate coil coupled with a power supply IC and the fixing member 807 is surrounded with this separate coil provided in the mounting board. Similarly with the embodiments described up to this point, power is supplied to the circuit included in the pellet of the semiconductor package including the protection member 806. The power is supplied through the coil provided in the package board of the semiconductor package including the protection member 806. With respect to the fixing members, the fixing member 805 may form a closed loop or an open loop integrally with the fixing member 807. This makes it unnecessary to provide a separate coil coupled with the power supply IC in the mounting board.

In the example in FIG. 9, the semiconductor package including the protection member 802 has the antenna 901. The semiconductor package including the protection member 806 has the antenna 902. In the second embodiment, the antennas for electrically coupling the respective semiconductor packages are formed as flat spiral antenna over the package boards included in the respective semiconductor packages. In the third embodiment, meanwhile, the individual semiconductor packages are mounted over the plane of the mounting board 801; therefore, the shape of each antenna is different from that in the second embodiment. More specific description will be given. It is required to communicate signals between the semiconductor package including the protection member 802 and the semiconductor package including the protection member 806. Therefore, the spiral shape of the antenna 901 and the spiral shape of the antenna 902 are opposed to each other. For this reason, each of the antennas 901, 902 is not formed only of a wiring extended over the package board included in the relevant semiconductor package. They are formed also using wirings extended in wiring layers in the package boards included in the respective semiconductor packages. When the antenna 901 and the antenna 902 are formed as mentioned above, it is possible to effectively increase the range within which communication can be carried out between antennas and wireless communication between the antennas 901 and 902 is enabled. Therefore, it is possible to communicate signals between the semiconductor package including the protection member 802 and the semiconductor package including the protection member 806. The invention disclosed in this specification can be hence implemented even when the two semiconductor packages are mounted over the plane of the one main surface of the mounting board 801.

With reference to FIG. 8 again, the semiconductor package mounted over the mounting board 801 and including the protection member 810 is not provided with a hole or a fixing member. This is based on the assumption that the semiconductor package including the protection member 810 is a semiconductor package equivalent to a conventional technology in which the invention disclosed in this specification is not implemented. One example of possible cases is that the semiconductor package including the protection member 810 is a semiconductor package from a competitor to which the invention disclosed in this specification is not applied. To operate the system 800, even in this case, it is required to communicate signals between the semiconductor package including the protection member 802 and the semiconductor package including the protection member 810. This is because the system 800 is operated when the circuits respectively included in the semiconductor packages mounted over the mounting board 801 communicate signals therebetween.

The semiconductor package including the protection member 810 is mounted over the mounting board 801 using solder balls as illustrated in FIG. 1. Thus the technique illustrated in FIG. 9 cannot be adopted for implementing the following: the semiconductor package including the protection member 802 and the semiconductor package including the protection member 806 are wirelessly electrically coupled together using the antenna 901 and the antenna 902.

In this case, consequently, the following measure can be taken: signals outputted by the semiconductor package including the protection member 802 using the antenna are received by a spiral antenna provided in the mounting board 801; and these received signals are transmitted to the semiconductor package including the protection member 810 by a route by way of a solder ball. More specific description will be given. Though not shown in the drawing, the mounting board 801 is provided with the spiral antenna in such a shape as that of the coil 703 in FIG. 7. Over the package board of the semiconductor package including the protection member 802, there is provided a spiral antenna in such a shape as that of the antenna 717 in FIG. 7. The spiral shape of this spiral antenna provided in the mounting board 801 and the spiral shape of this spiral antenna provided in the semiconductor package including protection member 802 like the antenna 717 in FIG. 7 are opposed to each other. This configuration makes it possible to transmit signals outputted by the semiconductor package including the protection member 802 to the semiconductor package including the protection member 810 after they are received at the mounting board 801.

This is the same with the electrical coupling between the semiconductor package including the protection member 806 and the semiconductor package including the protection member 810. However, it is unnecessary to purposely separately provide the mounting board 801 with a spiral antenna corresponding to the semiconductor package including the protection member 806 in the following cases: cases where the antenna provided in the mounting board 801 and receiving signals from the semiconductor package including the protection member 802 and the semiconductor package including the protection member 806 can communicate with each other in terms of distance.

Up to this point, description has been given to embodiments of the invention. However, other modifications those skilled in the art can conceive are also included in these embodiments. The scope of right of the invention is determined by "What is claimed is" and should not be construed as limited to the description of the embodiments.

What is claimed is:

1. A semiconductor package comprising:
 a package board;
 a pellet provided over the package board; and
 a protection member covering the package board and the pellet and including a hole penetrating the protection member.

2. The semiconductor package according to claim 1, wherein the package board includes another hole penetrating the package board.

3. The semiconductor package according to claim 2, wherein the package board includes a coil.

4. The semiconductor package according to claim 3, wherein the pellet includes a circuit receiving power supplied from the coil.

5. The semiconductor package according to claim 3 wherein the second hole is surrounded by the coil.

6. The semiconductor package according to claim 4, further comprising an antenna coupled to the circuit.

7. The semiconductor package according to claim 3, wherein the coil includes a wiring extended in a wiring layer formed between an upper surface of the package board and a lower surface of the package board.

8. The semiconductor package according to claim 4, further comprising a pad coupled to the coil and the circuit.

* * * * *